United States Patent
Zeng et al.

(10) Patent No.: US 9,523,717 B2
(45) Date of Patent: Dec. 20, 2016

(54) METHOD FOR MEASURING THE WAVEFORM CAPTURE RATE OF PARALLEL DIGITAL STORAGE OSCILLOSCOPE

(71) Applicant: University of Electronic Science and Technology of China, Chengdu (CN)

(72) Inventors: Hao Zeng, Chengdu (CN); Peng Ye, Chengdu (CN); Kuojun Yang, Chengdu (CN); Guang Yang, Chengdu (CN); Qinchuan Zhang, Chengdu (CN)

(73) Assignee: UNIVERSITY OF ELECTRONIC SCIENCE AND TECHNOLOGY OF CHINA, Chengdu, Sichuan Province (CN)

( * ) Notice: Subject to any disclaimer, the term of this patent is extended or adjusted under 35 U.S.C. 154(b) by 453 days.

(21) Appl. No.: 14/057,544

(22) Filed: Oct. 18, 2013

(65) Prior Publication Data

US 2014/0188419 A1    Jul. 3, 2014

(30) Foreign Application Priority Data

Oct. 22, 2012    (CN) .......................... 2012 1 0405981

(51) Int. Cl.
*G01R 29/00*    (2006.01)
*G01R 13/02*    (2006.01)

(52) U.S. Cl.
CPC ....... *G01R 13/0272* (2013.01); *G01R 13/0254* (2013.01)

(58) Field of Classification Search
CPC ............................ G01R 13/22; G01R 13/0272
See application file for complete search history.

(56) References Cited

U.S. PATENT DOCUMENTS

| | | | | |
|---|---|---|---|---|
| 5,578,917 A * | 11/1996 | Bottman | ................ | G01R 19/25 324/76.15 |
| 5,684,507 A * | 11/1997 | Rasnake | .............. | G01R 13/345 345/440.1 |
| 5,929,838 A * | 7/1999 | Hall | ..................... | G01R 13/029 345/440.1 |
| 6,311,138 B2 * | 10/2001 | Miller | .......................... | 702/125 |
| 6,781,584 B2 | 8/2004 | Shen et al. | | |
| 8,046,183 B2 | 10/2011 | Dobyns et al. | | |

(Continued)

FOREIGN PATENT DOCUMENTS

CN    101 281 224    6/2011

*Primary Examiner* — Hyun Park
(74) *Attorney, Agent, or Firm* — Vedder Price P.C.; Thomas J. Kowalski; Deborah L. Lu

(57) ABSTRACT

The present invention provides a method for measuring the waveform capture rate of parallel digital storage oscilloscope. On the basis of double pulse measurement, and in consideration of the asymmetry of acquisition and the refreshing time of parallel DSO, the present invention provides a step amplitude-frequency combined pulse measurement to measure the time for waveform acquisition and mapping $T_{map}$, the number of captured waveforms before LCD refreshing $W_{acq}$ and the dead time caused by LCD refreshing $T_{DDT}$, and then calculates the measured average WCR of parallel DSO, according to the measured data, so that the WCR of parallel can be measured.

3 Claims, 6 Drawing Sheets

(56) References Cited

U.S. PATENT DOCUMENTS

| | | |
|---|---|---|
| 8,179,443 B2 | 5/2012 | Tohyama |
| 8,374,811 B2 | 2/2013 | Sullivan et al. |
| 2005/0273284 A1* | 12/2005 | Pickerd .................. G11C 27/00 702/66 |

* cited by examiner

— Pulse Wave

METHOD FOR MEASURING THE WAVEFORM CAPTURE RATE OF PARALLEL DIGITAL STORAGE OSCILLOSCOPE

FIELD OF THE INVENTION

This application claims priority under the Paris Convention to Chinese Patent Application No. 201210405981.9, Filed Oct. 22, 2012, entirety of which is hereby incorporated by reference for all purposes as if fully set forth herein.

The present invention relates to the field of measurement of digital storage oscilloscope, more particularly to a method for measuring the waveform capture rate of parallel digital storage oscilloscope.

BACKGROUND OF THE INVENTION

1. Introduction

The digital storage oscilloscope (DSO) is a widely used in time-domain measurement, and the waveform capture rate (WCR) is an important index to evaluate the performance of DSO's data acquisition system. The WCR can be defined as "the number of waveforms that can be captured in a unit time (wfms/s)". It indicates the size of amount of information that the acquisition system can capture and display within the unit time. The higher WCR indicates the stronger capacity of the oscilloscope for capturing transient signal.

The WCR of DSO has been improved dramatically over the last ten years. For example, the WCRs of Tektronix Digital Phosphor Series Oscilloscopes range from 3600 wfms/s to 300,000 wfms/s, and the Infiniium 90000A Series DSOs from Agilent have achieved 400,000 wfms/s. Since the WCR is a critical indicator for DSO, all international instrument suppliers highlight the WCR as one of selling points.

We have put forward a method for measuring the waveform capture rate of DSO, which has been granted a patent on Jun. 1, 2011 with No. CN101281224B. The method is also called as "Double Pulses Measurement", and fills the gap of measuring the WCR of DSO. However, with this method, only the transient WCR of DSO can be measured, and the results just reflect the WCR at measuring moment. The inherent deficiency of this method is that the measured WCR cannot be used to evaluate capturing capacity during a certain time of interval. Due to the different techniques used by DSO manufacturers in the system structure and waveform display process, there may exist large bias when this method is adopted to measure the WCR of parallel DSO.

2. Review of Waveform Capture Rate

FIG. 1 is a diagram of dead time of data acquisition system.

The relation between actual dead time and acquire time, and the relation between effective dead time and display window are shown in FIG. 1.

The operation mode of DSO alternates between acquisition and processing of waveform data. After acquiring the waveform data, the microprocessor unit (MPU) of DSO will be involved in the processing of the acquired waveform data. DSO will not acquire the waveform data, while processing. Therefore, there exists a time gap between two waveform data acquisitions, and this "time gap" is called actual dead time. Obviously, the actual dead time is the time interval from the end of previous waveform data acquisition to the start of current waveform data acquisition. The effective dead time include actual dead time and the part of acquire time which is out of the display window. Part of waveform data in acquire time can be acquired, but can not be displayed. If the fault signal is located in the part of waveform, for instance, the second circle as shown in FIG. 1, the waveform data of the fault signal can be acquired, but can not been displayed. Therefore, the effective dead time is more important than the actual dead time in analyzing the performance of DSO, the dead time hereinafter referred to is effective dead time.

DSO starts to acquire the waveform data after the end of previous acquisition period, and does not monitor and capture the signal, thus leading to the loss of fault signal and a deceptive waveform display.

The occurrence of failure in circuit system generally does not follow any law, and it is very difficult for us to select an appropriate trigger condition to capture the fault signal. Therefore, the high WCR of DSO is very important to find the failure of circuit system and enhance the efficiency of measurement.

3. Deficiency of the Method for Measuring the WCR of DSO in Prior Art 3.1 Double Pulses Measurement For the first time, the method for measuring the WCR of DSO in prior art with double pulses solves the measurement problem of WCR through the external characteristic.

The principle of double pulses measurement is that, acquisition process is controlled by the trigger signal, and the time interval between two consecutive effective triggers would be the dead time.

As shown in FIG. 2, the measuring signal consists of consecutive pulse W1 and pulse W2, the width of pulse W1 is less than that of pulse W2. The rising edges of two pulses are trigger position t1 and t2, and T0 is an adjustable time interval between trigger position t1 and t2. When the time interval T0 is less than the dead time of DSO, the acquisition system of DSO can only capture and display the pulse W1; when the time interval T0 is greater than the dead time of DSO, the acquisition system of DSO can capture and display both pulse W1 and pulse W2; when the time interval T0 is adjusted exactly to critical time point that both pulse W1 and W2 can just be viewed, then the time corresponding to time interval T0 is the dead time of DSO.

In double pulses measurement, if the time interval T0 is small enough, there is no time for DSO to proceed with the next acquisition triggered by pulse W2 after pulse W1 is acquired due to the existence of the dead time, thus leading to the loss of pulse W2. By increasing the time interval T0, the measurement of WCR shall be completed when DSO can just capture the two pulse signals.

For convenience to observe, the two pulses have different widths. The observer can clearly determine the critical point for the occurrence or no occurrence of pulse W2. Since this critical point exactly demonstrates the shortest time of an acquisition, it ranges from the rising edge of the first pulse to that of the second pulse. This time interval is represented as $T_{0min}$.

The time interval $T_{0min}$ is the shortest time between two effective triggers, and also the shortest time needed in an acquisition and processing of DSO. Its reciprocal is the maximal WCR of DSO, and can be written as:

$$WCR_{max} = 1/T_{0min} \qquad (1).$$

3.2. Architecture of DSO

The conventional DSO is based on the serial structure, as shown in FIG. 3, 4. The waveform data acquired is sent to microprocessor, then processed, and finally displayed. The operation of serial DSO can be described as "acquiring a piece of waveform data, then processing slowly and displaying, and repeating the steps". The DSO would not monitor the signal under test, while "processing slowly". The period of "processing slowly" is "dead time". Generally, DSO based on serial structure can capture only 1% of waveforms and 99% of waveforms are lost within the "dead time", and that make the measurement inefficient. In other word, the rate to capture the signal under test is very low.

With the development of the DSO, the WCR has been given more and more considerations. Reducing the dead time as short as possible by improving the structure of the DSO's acquisition system and changing the acquisition and display mode is the key to enhance the WCR of DSO. In the late 1990s, Tektronix first developed a DSO with parallel structure, called Digital Phosphor Oscilloscope. Since that, the WCR of DSO has been improved dramatically.

As shown in FIG. 5, 6, DSO with parallel structure consists of three main parts: signal conditioning and triggering module, data acquisition and waveform parallel processor module, and microprocessor and display module.

Analog signal, i.e. signal under test is fed into ADC after conditioning, and is sampled under the control of trigger circuit and time base circuit. The waveform data sampled are delivered to the acquire storage. After a waveform data acquisition is completed, the waveform parallel coprocessor will map the waveform data in acquire storage into a waveform database, which corresponds to the dot-matrix. When the mapping is over, a new round of waveform acquisition and mapping will start. Meanwhile, the microprocessor will execute the calculation of waveform, menu management and man machine interface management. When the refresh time of LCD arrives, the display refresh controller will be started up, and combine the dot-matrix data in waveform database with that in interface database, then import the combined dot-matrix data into the display storage and refresh the display.

In parallel DSO, the acquisition and processing of waveform data and the operation of MPU are parallel, the MPU can extricate it from processing of waveform data and displaying. And the parallel architecture employed in DSO can reduce the dead time, and increase probability of capturing transient signal.

The way of capturing the signal under test by parallel DSO is that DSO acquires and maps the waveform data repeatedly, when refresh time of LCD arrives, the DSO stops the acquiring and mapping, and the waveform parallel coprocessor export the mapped data of plurality of waveforms to display storage. So we can see that the dead time of parallel DSO consists of two parts: the time introduced by waveform mapping and the time introduced by exporting the mapped waveform data at refresh time arriving.

3.3. Deficiency of Double Pulses Measurement

From the analysis of architecture of DSO, we can see that the double pulses measurement has significant limitations. Only the capture of two consecutive waveforms is scaled, therefore, the WCR obtained by double pulses measurement is a transient waveform capture rate of DSO. For serial DSO, since the time intervals between two acquisitions are usually symmetrical, the WCR obtained by double pulses measurement basically reflects the WCR in a unit time, the error is small. However, for parallel DSO, due to the particularity of its structure and mapping method, there are two different phases, each phase has a different dead time, and the WCRs in a refreshing period are asymmetrical. In such case, if the double pulses measurement is employed to evaluate the WCR, the results would be wrong, and much higher than the real value.

The parallel DSO is becoming a mainstream product in DSOs, a method for measuring the waveform capture rate of parallel digital storage oscilloscope is needed.

SUMMARY OF THE INVENTION

The present invention aims to overcome the deficiencies of prior art and provides a method for measuring the waveform capture rate of parallel digital storage oscilloscope in consideration of the asymmetry of acquisition and the refreshing time, so that the WCR of parallel can be measured.

To achieve these objectives, in accordance with the present invention, a method for measuring the waveform capture rate of parallel digital storage oscilloscope is provided, comprising the following steps:

(1) setting the parallel DSO with the time base which is corresponding to maximal WCR and provided by manufacturer, and obtaining the shortest capture time $T_{dp}$ of parallel DSO by double pulses measurement, wherein the maximal WRC is $1/T_{dp}$.

(2) locating the position of dead time caused by LCD refreshing and obtaining the number of waveforms before the refreshing of LCD through step amplitude-frequency combined pulse;

2.1) structuring a step amplitude-frequency combined pulse, wherein:

each pulse intervals of the step amplitude-frequency combined pulse are identical, i.e., the time intervals between the rising edges of each two consecutive pulses of the step amplitude-frequency combined pulse are identical, and the shortest capture time $T_{dp}$ is taken as the pulse interval;

the step amplitude-frequency combined pulse have X pluralities of pulses, each plurality of pulses have Y pulses which amplitudes increase progressively, and the pulses in same order of each plurality of pulses have the same amplitude; the pulses in same plurality of pulses have the same pulse width, and the pulse widths of X pluralities of pulses increase progressively;

the pulse amplitudes, pulse widths and amplitude increments in a plurality of pulses, and pulse width increments of two consecutive pluralities of pulses satisfy the observer to view the waveform on LCD;

2.2) setting the parallel DSO with the time base which is corresponding to maximal WCR and provided by manufacture, setting the parallel DSO with the input sensitivity that can make the maximal amplitude of the step amplitude-frequency combined pulse be displayed;

generating the first step amplitude-frequency combined pulse signal using a programmable arbitrary waveform generator, and inputting it into the parallel DSO as measuring signal, wherein the first step amplitude-frequency combined pulse signal comprises only one step amplitude-frequency combined pulse;

generating the second step amplitude-frequency combined pulse signal using a programmable arbitrary waveform generator, and inputting it into the parallel DSO as measuring signal, when the first step amplitude-frequency combined pulse is wholly displayed; and wherein the second step amplitude-frequency combined pulse signal comprises a start pulse and a step amplitude-frequency combined pulse, the time interval between the start pulse and the step amplitude-frequency combined pulse is $T_{dp} \times X \times Y$;

generating the third step amplitude-frequency combined pulse signal using a programmable arbitrary waveform generator, and inputting it into the parallel DSO as measuring signal, when the second step amplitude-frequency combined pulse is wholly displayed; and wherein the third step amplitude-frequency combined pulse signal comprises a start pulse and a step amplitude-frequency combined pulse, the time interval between the start pulse and the step amplitude-frequency combined pulse is $2 \times T_{dp} \times X \times Y$;

generating and judging the like, until only part of the step amplitude-frequency combined pulse is displayed; wherein the amplitude-frequency combined pulse signal inputted is P, and the time before position of dead time caused by LCD refreshing, i.e. the time for waveform acquisition and mapping $T_{map}$ is:

$$T_{map} = (P-1) \cdot T_{seg} + T_{seg\_P} \qquad (2)$$

where $T_{seg} = T_{dp} \times X \times Y$, and $T_{seg\_P}$ is the time corresponding to the displayed part of the step amplitude-frequency combined pulse, thus the position of dead time caused by LCD refreshing is located.

obtaining the number of captured pulses $W_{seg\_k}$ by observing the LCD of parallel DSO, when the step amplitude-frequency combined pulse signal k has been measured; wherein the number of waveforms that parallel DSO can capture before LCD refreshing is:

$$W_{acq} = \sum_{k=1}^{P} W_{seg\_k} \qquad (3)$$

(3) measuring the dead time caused by LCD refreshing, and calculating the average WCR of parallel DSO;

structuring a step amplitude-frequency combined pulse for measuring the dead time caused by LCD refreshing, wherein the structuring is identical with that of step 2.1 except pulse interval;

generating a step amplitude-frequency combined pulse signal using a programmable arbitrary waveform generator, and inputting it into the parallel DSO as measuring signal, wherein the step amplitude-frequency combined pulse signal comprises only one step amplitude-frequency combined pulse, the pulse interval $T_1$ of the step amplitude-frequency combined pulse increases from $T_{map}/(X \times Y)$ progressively, until the number of pulses displayed on the LCD of parallel DSO stop decreasing and increases;

obtaining the number of pulses $W_{DL}$ in the dead time caused by LCD refreshing through observing the LCD of parallel DSO:

$$T_{DDT} = W_{DL} \times T_1 \qquad (4)$$

calculating the measured average WCR of parallel DSO, according to the measured data:

$$WCR_{ave} = \frac{1(s)}{T_{DDT} + T_{map}} \times W_{acq}. \qquad (5)$$

The objectives of the present invention are realized as follows:

On the basis of double pulse measurement, and in consideration of the asymmetry of acquisition and the refreshing time of parallel DSO, the present invention provides a step amplitude-frequency combined pulse measurement to measure the time for waveform acquisition and mapping $T_{map}$, the number of captured waveforms before LCD refreshing $W_{acq}$ and the dead time caused by LCD refreshing $T_{DDT}$, and then calculates the measured average WCR of parallel DSO, according to the measured data, so that the WCR of parallel can be measured.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
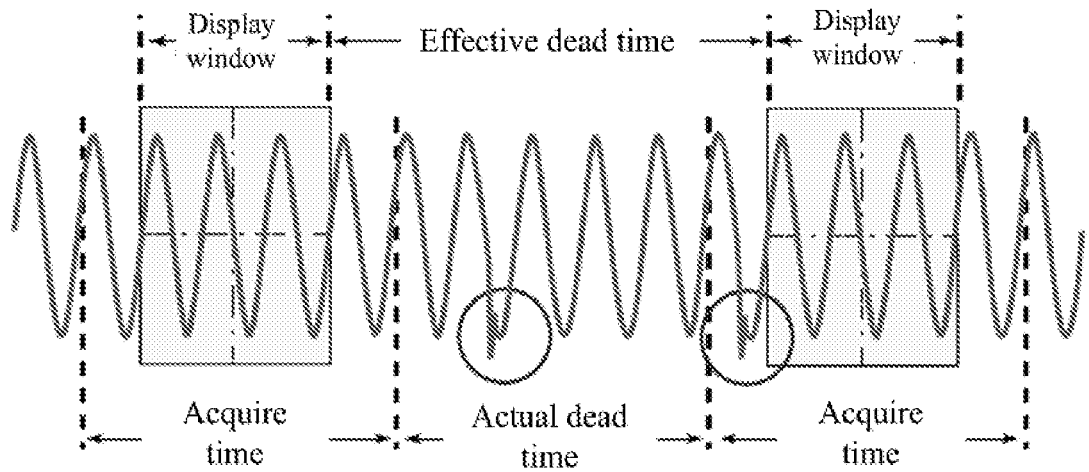
FIG. 1 is a diagram of dead time of data acquisition system.
Figure 2:
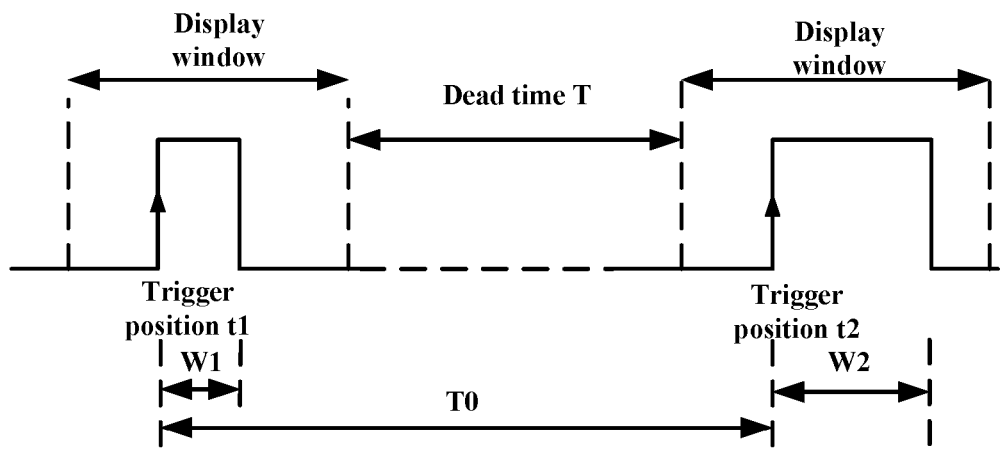
FIG. 2 is a diagram of measuring signal with double pulse.
Figure 3:
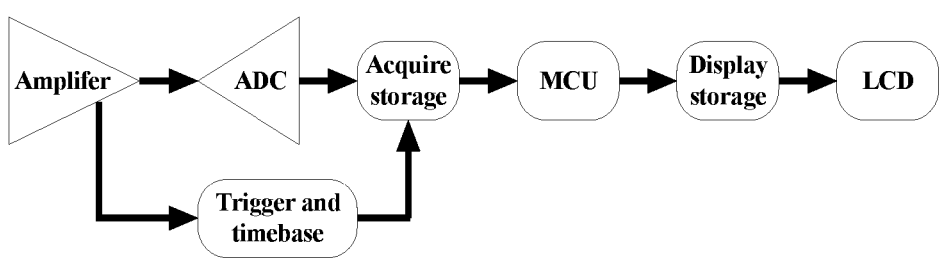
FIG. 3 is a schematic diagram of conventional DSO.
Figure 4:
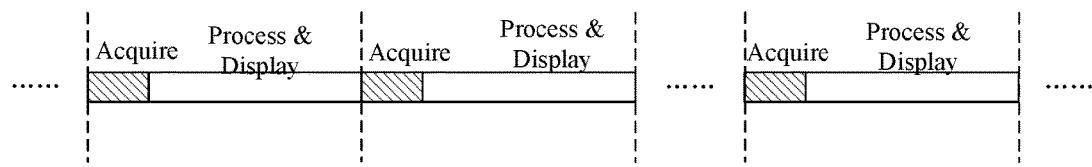
FIG. 4 is a diagram of waveform capture process of conventional DSO.
Figure 5:
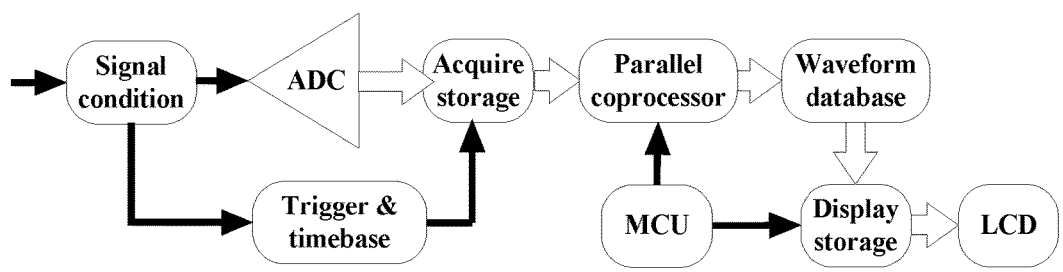
FIG. 5 is a schematic diagram of parallel DSO.
Figure 6:
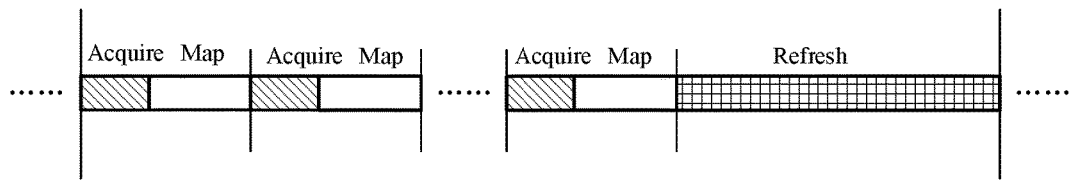
FIG. 6 is a diagram of waveform capture process of parallel DSO.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Figure 7:
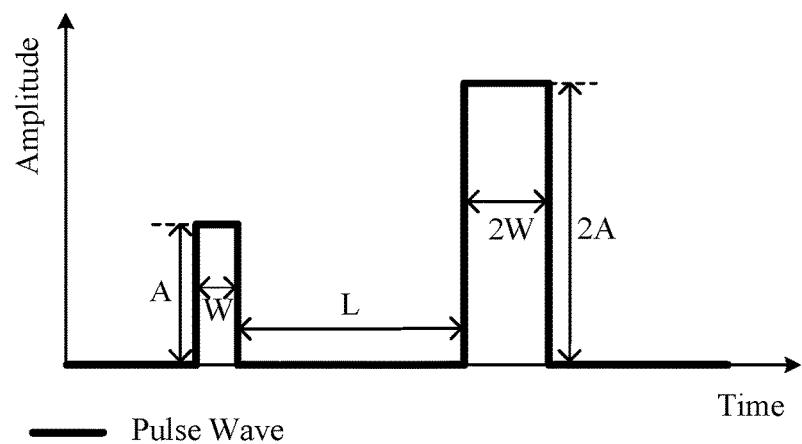
FIG. 7 is a diagram of measuring signal with double pulse according to one embodiment of the present invention.

In one embodiment, the method for measuring the waveform capture rate of parallel digital storage oscilloscope comprises the following concrete steps:

A. obtaining the shortest capture time $T_{dp}$ of parallel DSO by double pulses measurement, wherein the maximal WRC is $1/T_{dp}$;

setting the parallel DSO with the time base which is corresponding to maximal WCR, and inputting the measuring double pulses signal; As shown in FIG. 7, the width of the first pulse W is the time corresponding to the time base, the amplitude and width of the second pulse are twice that of the first pulse, the time interval of the two pulses L is the reciprocal of the waveform capture rate which is provided by manufacturer;

generating a double pulses signal, and inputting it to the DSO; observing the DSO, judging whether the two pulses are captured; wherein if only one pulse is captured, that shows the parallel DSO can't complete the capture of the two pulses within the time interval L, and the time interval L needs increasing; otherwise if the two pulses are captured, the time interval L needs decreasing; adjusting the time interval L of the two pulses, until the critical point of time interval L' is captured, the shortest capture time $T_{dp}=L'$, and the maximal WRC is $1/T_{dp}$;

B. locating the position of dead time caused by LCD refreshing and obtaining the number of waveforms before the refreshing of LCD through step amplitude-frequency combined pulse;

Due to the limitation of parallel DSO's LCD, the observer can only distinguish a certain number of pulse waveforms on a LCD. In the embodiment, the parallel DSO has the number of horizontal lattices $DIV_X$ and the number of vertical lattices $DIV_Y$, then the number of waveform pulses N that can make the parallel DSO's LCD be distinguishing is defined as:

$$N = X \times Y \qquad (6)$$
$$X = DIV_X - 1; Y = \left(\frac{DIV_Y - 1}{0.5} - 1\right)$$

Figure 8:
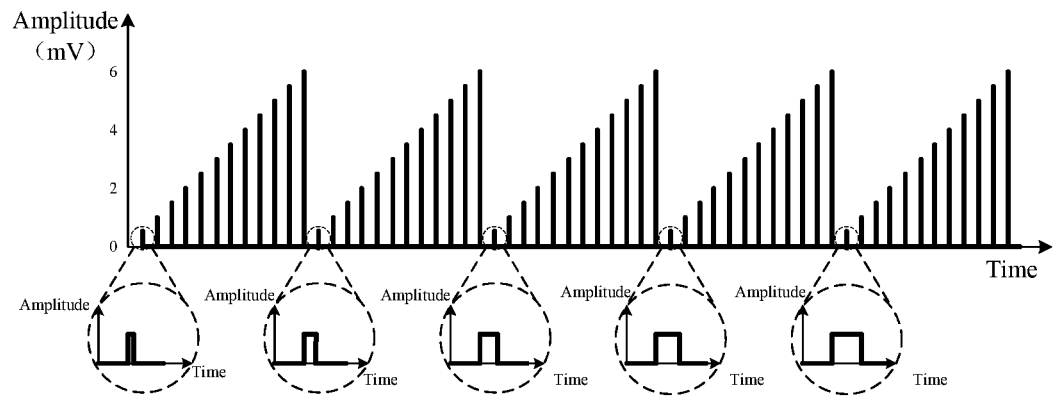
FIG. 8 is a diagram of step amplitude-frequency combined pulse according to one embodiment of the present invention.

Each pulse intervals of the step amplitude-frequency combined pulse are identical, i.e., the time intervals between the rising edges of each two consecutive pulses of the step amplitude-frequency combined pulse are identical, and the shortest capture time $T_{dp}$ is taken as the pulse interval. As shown in FIG. 8, the waveform of step amplitude-frequency combined pulse shall be generated according to the following rules.

The amplitude for pulse i:

$$A_i = A_{min} + \left[(i) \bmod\left(\frac{DIV_Y - 1}{0.5} - 1\right)\right]\Delta A, (i=1, 2, \ldots, N) \qquad (7)$$

where $A_{min}$ refers to the minimum pulse amplitude, its numeric value equals to the amplitude of one lattice on the LCD of parallel DSO; mod refers to residue arithmetic, $\Delta A_{min}$ refers to the progressively increasing amplitude of two consecutive pulses and its numeric value equals to the amplitude of half lattice on the LCD of parallel DSO.

The width for pulse i:

$$P_i = P_{min} + \left\lfloor\frac{i-1}{\left(\frac{DIV_Y - 1}{0.5} - 1\right)}\right\rfloor \Delta P, (i=1, 2, \ldots, N) \qquad (8)$$

where $P_{min}$ refers to the minimum width of the pulse, its numeric value equals to the time of one lattice on the LCD of parallel DSO. $\lfloor\ \rfloor$ refers to round arithmetic, the $\Delta P$ refers to the progressively increasing width of the pulse and its the numeric value equals to $P_{min}$.

The step amplitude-frequency combined pulse structured is shown in FIG. 8.

Figure 9:
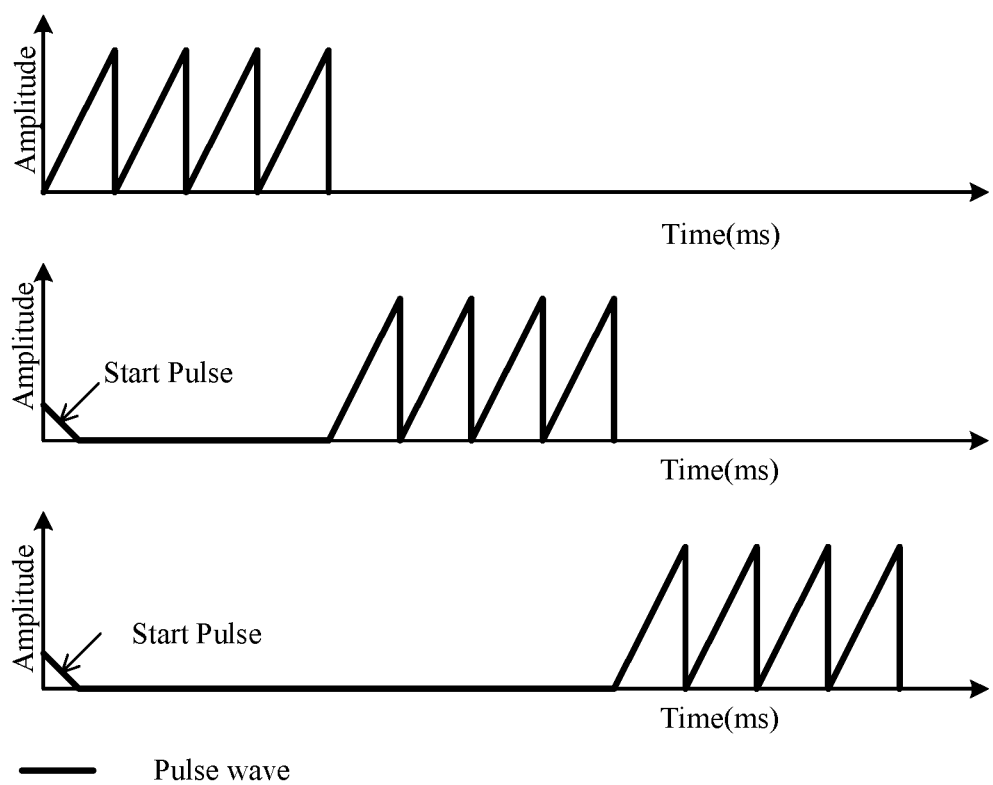
FIG. 9 is a waveform diagram of the first to the third step amplitude-frequency combined pulse signal according to one embodiment of the present invention.

Due to the limitation of number of pulses, the measuring time range of a step amplitude-frequency combined pulse signal shall be $T_{seg}=T_{dp} \times N$. In order to conduct the measuring at a wider time range, the regularity of each acquisition process under the normal trigger mode can be utilized to generate a plurality of step amplitude-frequency combined pulse signals on interleaved time to meet the requirements for measuring of acquisition process at a wider time range. As shown in FIG. 9, the start pulse is a triangular wave with falling slope.

Figure 10:
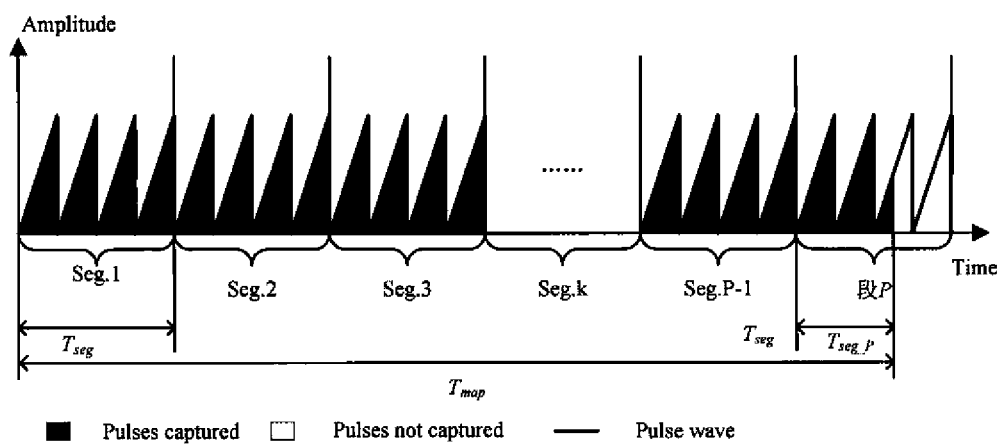
FIG. 10 is a waveform diagram while appearing the dead time caused by LCD refreshing according to one embodiment of the present invention.
Figure 11:
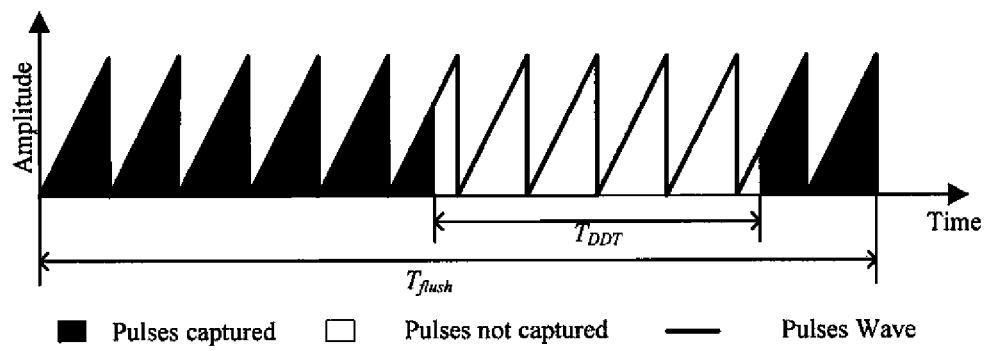
FIG. 11 is a waveform diagram including the whole dead time caused by LCD refreshing according to one embodiment of the present invention.

The plurality of step amplitude-frequency combined pulse signals is inputted to the parallel DSO in turn. When the amplitude-frequency combined pulse signal P is inputted, and only part of step amplitude-frequency combined pulse is displayed, as shown in FIG. 10, the position of amplitude-frequency combined pulse signal P that can't be displayed is corresponding to the position of dead time caused by LCD refreshing.

the position of dead time caused by LCD refreshing can be obtained by observing captured pulses $W_{seg\_k}$ on the LCD of parallel DSO, meanwhile, the time before position of dead time caused by LCD refreshing, i.e. the time for waveform acquisition and mapping:

$$T_{map} = (P-1) \cdot T_{seg} + T_{seg\_P} \qquad (2)$$

where $T_{seg\_P}$ is the time corresponding to the displayed part of the step amplitude-frequency combined pulse, thus the position of dead time caused by LCD refreshing is located.

obtaining the number of captured pulses $W_{seg\_k}$ by observing the LCD of parallel DSO, when the step amplitude-frequency combined pulse signal k is been measured; the number of waveforms that parallel DSO can capture before LCD refreshing is:

$$W_{acq} = \sum_{k=1}^{P} W_{seg\_k} \qquad (3)$$

measuring the dead time caused by LCD refreshing, and calculating the average WCR of parallel DSO;

Since the step amplitude-frequency combined pulse has the time measurement function, it also can be used to measure the dead time caused by LCD refreshing. The result measured includes the whole dead time caused by LCD refreshing, which is shown in FIG. 11. Thus, the dead time caused by LCD refreshing can be obtained by calculating according to the number of pulses which is not displayed, where $T_{flush}$ is measuring time.

generating a step amplitude-frequency combined pulse signal using a programmable arbitrary waveform generator, and inputting it into the parallel DSO as measuring signal, wherein the step amplitude-frequency combined pulse signal comprises only one step amplitude-frequency combined pulse, the pulse interval $T_1$ of the step amplitude-frequency combined pulse increases from $T_{map}/(X \times Y)$ progressively, until the number of pulses displayed on the LCD of parallel DSO stop decreasing and increases;

obtaining the number of pulses $W_{DL}$ in the dead time caused by LCD refreshing through observing the LCD of parallel DSO:

$$T_{DDT} = W_{DL} \times T_1 \qquad (4)$$

calculating the measured average WCR of parallel DSO, according to the measured data:

$$WCR_{ave} = \frac{1(s)}{T_{DDT} + T_{map}} \times W_{acq} \qquad (5)$$

Test for verification and analysis

Using the method of present invention, the WCRs of some prevailing DSOs of serial or parallel structure are measured, and the measuring results are as shown in Table 1. Table 1 lists the essential parameters of measured DSO.

TABLE 1

| Model | Manufacturer | Structure | Nominal WCR |
|---|---|---|---|
| TDS2102C | Tektronix (USA) | serial | 1,000 wfms/s |
| DPO4034 | Tektronix (USA) | parallel | 50,000 wfms/s |
| DSO6102A | Agilent (USA) | parallel | 100,000 wfms/s |
| UTD8102C | UNI-T (China) | parallel | 15,000 wfms/s |

In the test, the programmable arbitrary waveform generator is AWG5014B from the manufacture of Agilent, it has sample rate of 1.2 Gs/S, 14-bits vertical resolution and 32M memory depth. The step amplitude-frequency combined pulse signal is generated by programming it.

In accordance with the method of present invention, measurement for the WCR of DSO listed in Table 1 has been conducted respectively and the measurement results are as shown in Table 2. Table 2 is measurement Results for WCRs of dfferent types of DSOs By comparing Table 1 and Table 2, it can be seen that when measured with double pulses measurement, the WCR of serial DSO TDS2012C is close to its nominal value; while the measurement results of the parallel DSOs are generally about 15% higher than the nominal values. The comparison demonstrates that the double pulses measurement has its limitation, and can only be used for measuring the WCR of serial DSO.

The other 3 sets of parallel DSOs are measured by using the method of present invention, the measurement results show that: 1. there does exist two parts of dead time, i.e. the dead time caused by waveform mapping and the dead time caused by LCD refreshing; 2. the measured average WCR measured with the method of present invention is close to the nominal value, that is to say, it verifies the correctness of the method of present invention.

Figure 12:
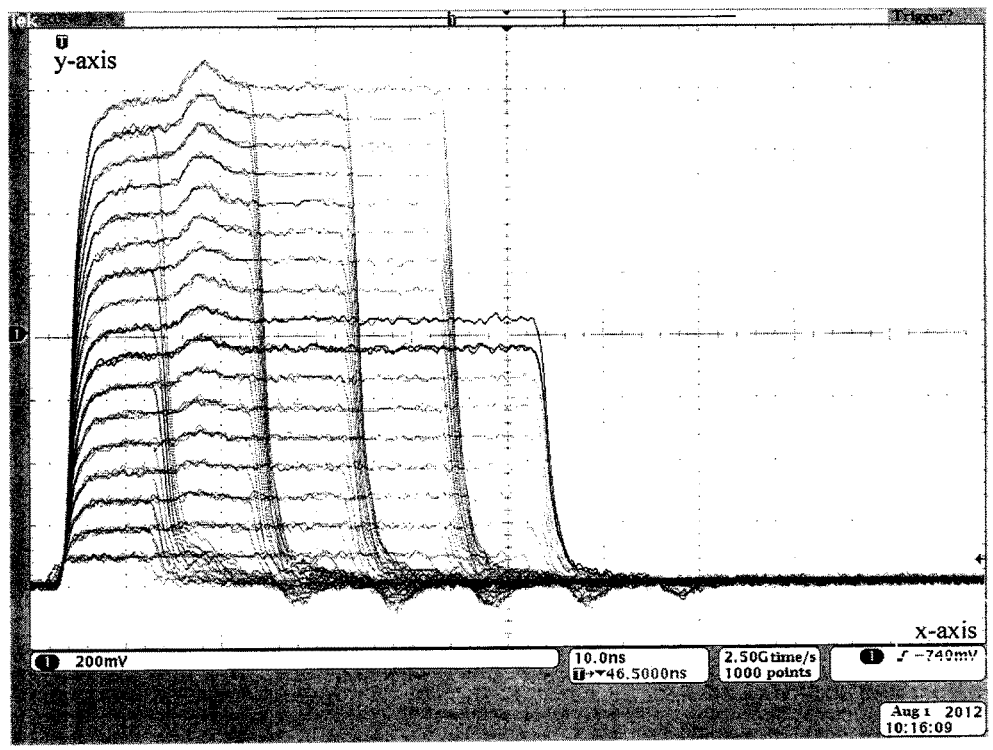
FIG. 12 is a waveform diagram of the last step amplitude-frequency combined pulse signal captured by DPO4024 according to one embodiment of the present invention.

Table 2 shows that when locating the position of dead time caused by LCD refreshing of Tektronix DPO4034, there is totally 27 step amplitude-frequency combined pulse signals for measurement, and the pulses of each step amplitude-frequency combined pulse signal are 153, the pulse interval is 17.25 μs. The measurement results shown in FIG. 12 reflect the capturing of the last step amplitude-frequency combined pulse signal, only 77 pulses in the front are captured. So the effective time for capturing of the step amplitude-frequency combined pulse is only 1.32 ms. After the measurement of this step completes, the time for waveform acquisition and mapping and the number of waveforms that parallel DSO can capture before LCD refreshing are obtained.

Figure 13:
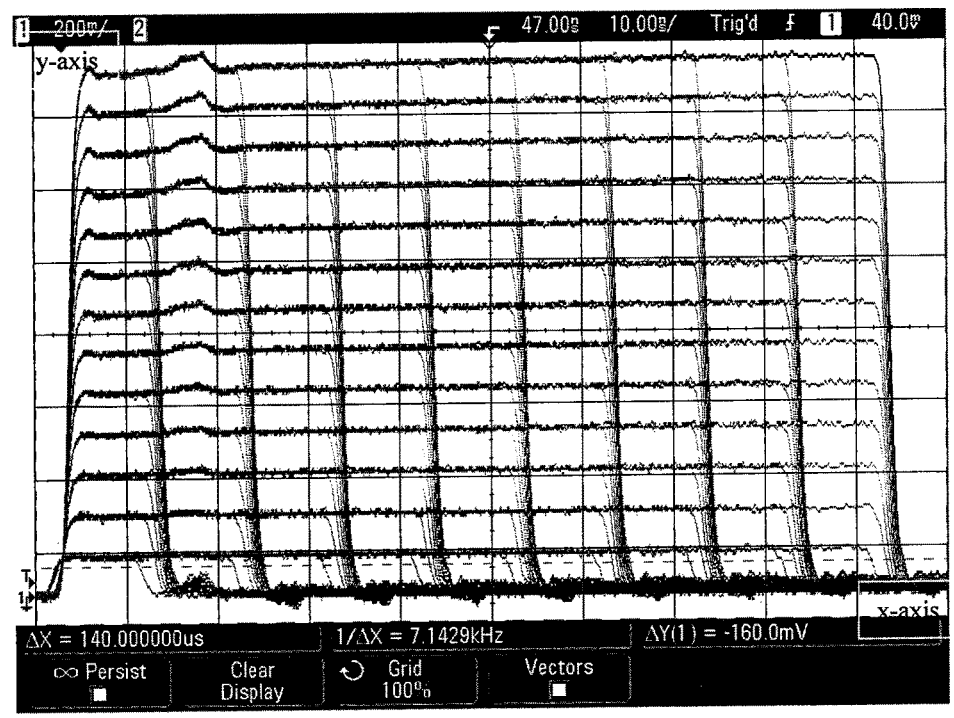
FIG. 13 is a waveform diagram of the first step amplitude-frequency combined pulse signal captured by DPO6102A according to one embodiment of the present invention.

Table 2 shows that when locating the position of dead time caused by LCD refreshing of Agilent DSO6102A, there is totally 43 step amplitude-frequency combined pulse signals for measurement, and the pulses of each step amplitude-frequency combined pulse signal are 117, the pulse interval is 8.54 μs. The measurement results shown in FIG. 13 reflect the capturing of the first step amplitude-frequency combined pulse signal, and all 117 pulses are captured.

Figure 14:
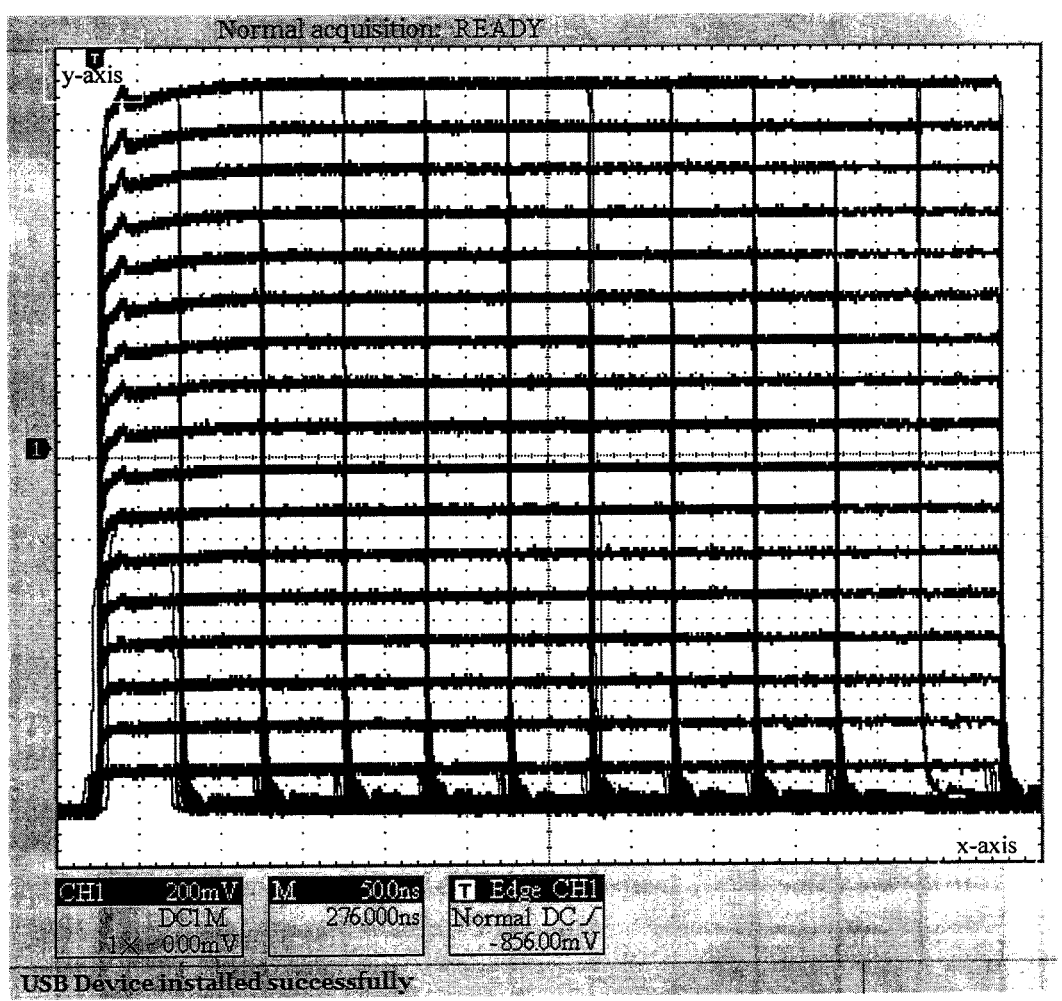
FIG. 14 is a waveform diagram of the step amplitude-frequency combined pulse signal captured by UTD8102C while measuring the dead time caused by LCD refreshing according to one embodiment of the present invention.

Table 2 shows that when measuring the dead time caused by LCD refreshing of UNI-T UTD8102C, the pulses of the step amplitude-frequency combined pulse signal are 187, the pulse interval is 384 μs. The number of combined pulse generated is 187, the time interval of the combined pulse is around 384 μs. The results shown in FIG. 14 reflect that there are 17 continuous pulses of the total 187 pulses are not captured, thus, the dead time caused by LCD refreshing is about 6.42 ms. While illustrative embodiments of the invention have been described above, it is, of course, understand that various modifications will be apparent to those of ordinary skill in the art. Such modifications are within the spirit and scope of the invention, which is limited and defined only by the appended claims.

TABLE 2

| Model | N (waveforms that can be distinguished on LCD of DSO) | WCR with double pulses measurement $1/T_{dp}$ (wfms/s) | The measurement results with step amplitude-frequency pulse | | | | The measurement results of the dead time caused by LCD refreshing | | |
|---|---|---|---|---|---|---|---|---|---|
| | | | P (seg) | $T_{seg}$ (ms) | $T_{seg\_P}$ (ms) | $T_{map}$ (ms) | $W_{acq}$ (wfms/s) | $T_I$ (μs) | $T_{DDT}$ (ms) | $WCR_{ave}$ (wfms/s) |
| TDS2012C | — | 986 | — | — | — | — | — | — | — | — |
| DPO4034 | 153 | 57,971 | 27 | 2.64 | 1.32 | 69.94 | 3,990 | 583.75 | 10.63 | 49,518 |
| DSO6102A | 117 | 117,096 | 43 | 1.01 | 0.39 | 42.36 | 4,919 | 488.21 | 9.47 | 94,921 |
| UTD8102C | 187 | 17,452 | 6 | 10.72 | 4.61 | 58.19 | 950 | 384.38 | 6.42 | 14,705 |

What is claimed is:

1. A method for measuring a waveform capture rate (WCR) of a parallel digital storage oscilloscope (DSO) having a liquid crystal display (LCD), comprising the following steps:

(1) setting the parallel DSO with a time base corresponding to a maximal WCR provided by a manufacturer of the DSO, and obtaining the shortest capture time $T_{dp}$ of parallel DSO by double pulses measurement, wherein the maximal WRC is $1/T_{dp}$;

(2) locating a position of dead time caused by LCD refreshing and obtaining a number of waveforms before the LCD refreshing through;
  2.1) structuring a step amplitude-frequency combined pulse, wherein:
    each pulse interval of the step amplitude-frequency combined pulse is identical, such that time intervals between rising edges of each two consecutive pulses of the step amplitude-frequency combined pulse are identical, and the shortest capture time $T_{dp}$ is taken as the pulse interval;
    the step amplitude-frequency combined pulse has X pluralities of pulses, each plurality of pulses have Y pulses having amplitudes that increase progressively, and pulses in same order of each plurality of pulses have a same amplitude; pulses in same plurality of pulses have a same pulse width, and pulse widths of X pluralities of pulses increase progressively;
    pulse amplitudes, pulse widths and amplitude increments in a plurality of pulses, and pulse width increments of two consecutive pluralities of pulses thereby allowing an observer to view the waveform on LCD;
  2.2) setting the parallel DSO with a time base corresponding to maximal WCR provided by the manufacturer of the DSO, setting the parallel DSO with input sensitivity such that a maximal amplitude of the step amplitude-frequency combined pulse is displayed;
    generating a first step amplitude-frequency combined pulse signal using a programmable arbitrary waveform generator, and inputting the first step amplitude-frequency combined pulse signal into the parallel DSO as measuring signal, wherein the first step amplitude-frequency combined pulse signal comprises only one step amplitude-frequency combined pulse;
    generating a second step amplitude-frequency combined pulse signal using a programmable arbitrary waveform generator, and inputting the second step amplitude-frequency combined pulse signal into the parallel DSO as measuring signal, when the first step amplitude-frequency combined pulse is wholly displayed; and wherein the second step amplitude-frequency combined pulse signal comprises a start pulse and a step amplitude-frequency combined pulse, a time interval between the start pulse and the step amplitude-frequency combined pulse of the second step amplitude-frequency combined pulse signal is $T_{dp} \times X \times Y$;
    generating a third step amplitude-frequency combined pulse signal using a programmable arbitrary waveform generator, and inputting the third step amplitude-frequency combined pulse signal into the parallel DSO as measuring signal, when the second step amplitude-frequency combined pulse is wholly displayed; and wherein the third step amplitude-frequency combined pulse signal comprises a start pulse and a step amplitude-frequency combined pulse, a time interval between the start pulse and the step amplitude-frequency combined pulse of the third step amplitude-frequency combined pulse signal is $2 \times T_{dp} \times X \times Y$;
    generating, displaying and adjusting a resulting signal until only part of the step amplitude-frequency combined pulse is displayed; wherein an amplitude-frequency combined pulse signal inputted is P, and a time before position of dead time caused by LCD refreshing such that a time for waveform acquisition and mapping is:

$$T_{map} = (P-1) \times T_{seg} + T_{seg\_P}$$

where $T_{seg} = T_{dp} \times X \times Y$, and $T_{seg\_P}$ is a time corresponding to the displayed part of the step amplitude-frequency combined pulse, thereby a position of dead time caused by LCD refreshing is located;
    obtaining a number of captured pulses $W_{seg\_k}$ by observing the LCD of parallel DSO, when a step amplitude-frequency combined pulse signal k has been measured; wherein the number of waveforms that parallel DSO can capture before LCD refreshing is:

$$W_{acq} = \sum_{k=1}^{P} W_{seg\_k}$$

(3) measuring the dead time caused by LCD refreshing, and calculating an average WCR of the parallel DSO;
  structuring a step amplitude-frequency combined pulse for measuring a dead time caused by LCD refreshing, wherein the structuring is identical with that of step 2.1 except pulse interval;
  generating a step amplitude-frequency combined pulse signal using a programmable arbitrary waveform generator, and inputting the step amplitude-frequency combined pulse signal into the parallel DSO as measuring signal, wherein the step amplitude-frequency combined pulse signal comprises only one step amplitude-frequency combined pulse, a pulse interval $T_1$ of the step amplitude-frequency combined pulse increases from $T_{map}/(X \times Y)$ progressively, until a number of pulses displayed on the LCD of parallel DSO stop decreasing and increases;
  obtaining a number of pulses $W_{DL}$ in the dead time caused by LCD refreshing through observing the LCD of parallel DSO:

$$T_{DDT} = W_{DL} \times T_1$$

calculating a measured average WCR of parallel DSO, according to the measured data:

$$WCR_{ave} = \frac{1(s)}{T_{DDT} + T_{map}} \times W_{acq}.$$

2. A method for measuring the waveform capture rate of parallel digital storage oscilloscope of claim 1, wherein the number of pluralities X and the number of pulses Y of each plurality in the step amplitude-frequency combined pulse are given according to the following equation:

$$X = DIV_X - 1; \quad Y = \left(\frac{DIY_Y - 1}{0.5} - 1\right);$$

where $DIV_X$ is a number of horizontal lattices of parallel DSO, $DIV_Y$ is a number of vertical lattices of parallel DSO.

3. A method for measuring the waveform capture rate of parallel digital storage oscilloscope of claim 2, wherein the waveform of step amplitude-frequency combined pulse shall be generated according to the following rules:

an amplitude for pulse i:

$$A_i = A_{min} + \left[(i)\mathrm{mod}\left(\frac{DIY_Y - 1}{0.5} - 1\right)\right]\Delta A, (i = 1, 2, \ldots, N)$$

where $A_{min}$ refers to the minimum pulse amplitude, its numeric value equals to the amplitude of one lattice on the LCD of parallel DSO; mod refers to residue arithmetic, $\Delta A_{min}$ refers to the progressively increasing amplitude of two consecutive pulses and its numeric value equals to the amplitude of half lattice on the LCD of parallel DSO;
the width for pulse i:

$$P_i = P_{min} + \left\lfloor \frac{i-1}{\left(\frac{DIV_Y - 1}{0.5} - 1\right)} \right\rfloor \Delta P, (i = 1, 2, \ldots, N)$$

where $P_{min}$ refers to the minimum width of the pulse, its numeric value equals to the time of one lattice on the LCD of parallel DSO. $\lfloor\ \rfloor$ refers to round arithmetic, the $\Delta P$ refers to the progressively increasing width of the pulse and its the numeric value equals to $P_{min}$.

* * * * *